(12) United States Patent
Bao et al.

(10) Patent No.: US 7,001,833 B2
(45) Date of Patent: Feb. 21, 2006

(54) METHOD FOR FORMING OPENINGS IN LOW-K DIELECTRIC LAYERS

(75) Inventors: Tien-J Bao, Hsin-Chu (TW); Lih-Ping Li, Hsinchu (TW); Syun-Ming Jang, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 5 days.

(21) Appl. No.: 10/808,801

(22) Filed: Mar. 25, 2004

(65) Prior Publication Data

US 2005/0130411 A1 Jun. 16, 2005

Related U.S. Application Data

(63) Continuation-in-part of application No. 10/256,400, filed on Sep. 27, 2002, now abandoned.

(51) Int. Cl.
*H01L 21/44* (2006.01)

(52) U.S. Cl. .................. 438/597; 637/636; 637/780; 637/952

(58) Field of Classification Search ............. 438/597, 438/600, 706, 710, 714, 624, 637, 636, 780, 438/952
See application file for complete search history.

(56) References Cited

U.S. PATENT DOCUMENTS

| 5,926,740 | A | 7/1999 | Forbes et al. ............ 438/763 |
|---|---|---|---|
| 6,054,379 | A | 4/2000 | Yau et al. ............ 438/623 |
| 6,121,130 | A | 9/2000 | Chua et al. ............ 438/623 |
| 6,159,871 | A | 12/2000 | Loboda et al. ............ 438/786 |
| 6,168,726 | B1 | 1/2001 | Li et al. ............ 216/79 |
| 6,365,320 | B1 | 4/2002 | Foote et al. ............ 430/270.1 |
| 6,372,661 | B1 | 4/2002 | Lin et al. ............ 438/769 |
| 6,376,392 | B1 | 4/2002 | Lee et al. ............ 438/778 |
| 6,798,043 | B1 * | 9/2004 | Steiner et al. ............ 257/637 |
| 6,821,905 | B1 * | 11/2004 | Pan et al. ............ 438/706 |
| 6,879,046 | B1 * | 4/2005 | Gibson et al. ............ 257/760 |
| 2003/0087043 | A1 * | 5/2003 | Edelstein et al. ............ 427/569 |
| 2003/0134495 | A1 * | 7/2003 | Gates et al. ............ 438/600 |

* cited by examiner

*Primary Examiner*—B. William Baumeister
*Assistant Examiner*—Igwe U. Anya
(74) *Attorney, Agent, or Firm*—Haynes and Boone, LLP

(57) ABSTRACT

A method for etching contact/via openings in low-k dielectric layers is described. The method introduces a carbon deficient ARL which is compatible with the acidic photoresists used by DUV photolithography. The carbon deficiency of the ARL permits the use of fluorocarbon plasma etching ambients to etch the openings in the low-k layers without excessive polymer formation, thereby eliminating polymer pinch-off during the etching of deep, high aspect ratio contacts and vias in sub-tenth micron integrated circuit technology. Vertical walled contact and via openings may be formed using a DUV photoresist mask and non-oxygen containing fluorocarbon etching plasmas. An additional hardmask is therefore not needed. For non-carbon containing low-k dielectric layers the openings may be etched in simple fluorocarbon plasmas without excessive polymer formation. For low carbon low-k dielectric materials such as alky and aryl polysilsesquioxanes and some organosilicate glasses, the method provides a regimen of hydrogen addition to the etching plasma in order to sufficiently control polymer formation during the contact/via etch to obtain high quality vertical walled openings.

22 Claims, 7 Drawing Sheets

METHOD FOR FORMING OPENINGS IN LOW-K DIELECTRIC LAYERS

This Patent Application is a Continuation-in-Part of U.S. patent application Ser. No. 10/256,400, filed on Sep. 27, 2002, now abandoned which is hereby incorporated by reference in its entirety.

BACKGROUND OF THE INVENTION (1) Field of the Invention

The invention relates to processes for the manufacture of semiconductor devices and more particularly to processes for forming contacts/vias for interconnection wiring in low-dielectric constant insulators.

(2) Description of Prior Art and Background to the Invention

Complimentary metal oxide semiconductor(CMOS) field effect transistor(FET) technology involves the formation n-channel FETs (NMOS) and p-channel FETs(PMOS) in combination to form low current, high performance integrated circuits. The complimentary use of NMOS and PMOS devices, typically in the form of a basic inverter device, allows a considerable increase of circuit density of circuit elements by reduction of heat generation. The increase in device density accompanied by the shrinkage of device size has resulted in improved circuit performance and reliability as well as reduced cost. For these reasons CMOS integrated circuits have found widespread use, particularly in digital applications.

The basic MOSFET, whether it be NMOS or PMOS is typically formed by a self-aligned polysilicon gate process. An region of active silicon region surface for the device is defined on a silicon wafer by an opening surrounded by field oxide isolation(FOX). A gate oxide is then grown on the exposed silicon regions and a polysilicon gate electrode is patterned over the gate oxide. Source and drain regions are next formed in the active region, typically by ion implantation. The device is completed by depositing an insulative layer over the wafer and forming contacts to the source/drain regions and to the gate electrode through openings in the insulative layer. Successive levels of interconnection wiring are then formed over the device separated by dielectric layers. The wiring levels are patterned in conductive layers by photolithography and interconnected through vias in the dielectric layers.

With the introduction to DUV (deep ultraviolet) photolithography into the manufacturing of sub quarter micron integrated circuits, it was necessary to develop a new class of photoresist material which are sensitive to shorter wavelengths. DUV photolithography uses radiation at wavelengths at 248 nm. and 193 nm. derived from KrF and KrAr excimer lasers respectively. The photoresist materials used in DUV photolithography are acid catalyzed and are sensitive to the presence of trace levels of alkaline chemicals.

When these resist materials are used to pattern reflective conductive layers such as polysilicon, metal silicides, and metals such as aluminum and copper, an ARL (anti reflective layer) must be applied over the conductive layer, beneath the photoresist, in order to prevent exposure of photoresist at pattern edges by incident radiation from the reflective surface. The ARL is frequently referred to as an ARC (anti-reflective coating). Exposure by these unwanted reflections causes loss of definition at the pattern edges.

A material which has been used as an effective ARL for use with DUV photolithography because of it's high absorptive index at DUV wavelengths is silicon oxynitride (SiON, sometimes written as $SiO_xN_y$). SiON can be optimized with regard to it's anti reflection properties by varying it's composition. A variation of silicon oxynitride, having optical properties suitable for use with DUV photolithography is silicon oxime ($Si_{(1-x+y+z)}N_xO_y:H_2$, reported by Foote, et. al., (U.S. Pat. No. 6,365,320 B1). A problem encountered by the use of oxynitride ARCs under acidic photoresists involves an interaction between the acidic resist and the basic ammoniacal or amido functional groups on the SiON surface. These groups react with the lower photoresist interface to cause a sensitivity aberration at the base of the resist layer. This is commonly referred to as a footing problem.

Foote, et. al. overcomes the footing problem by forming a thin $SiO_2$ barrier layer between the ARL and the DUV photoresist. However, this introduces an additional processing step. It therefore became desirable to eliminate nitrogen in ARLs used with DUV photoresist. This led to development of a nitrogen-free ARL (NFARL) for DUV photolithography. Silicon oxycarbide (SiOC) was found by Lee, et. al., (U.S. Pat. No. 6,376,392, B1) not only to be an effective ARL for DUV photolithography but also, eliminated the footing problem by virtue of its being nitrogen free. Lee, et. al. forms the silicon oxycarbide film using silane and methyl containing silane precursors. Silicon oxycarbide, formed by PECVD (plasma enhanced chemical vapor deposition) using an oxygen containing species, preferably $N_2O$, and a methyl containing silane as precursors was reported earlier by Loboda, et. al. (U.S. Pat. No. 6,159,871). It was promoted by Loboda, et. al. as a low dielectric constant film but not as an ARL. However, earlier yet, Forbes, et. al., (U.S. Pat. No. 5,926,740) cited an amorphous silicon oxycarbide ARL formed either by high temperature pyrolysis of silicone resins, or by PECVD from silane, methane, and nitrous oxide precursors.

The silicon oxycarbide NFARL resolves the DUV photolithography problems when used to pattern reflective conductive layers such as polysilicon, metal silicides, and metals such as aluminum and copper. However, when used as an ARL in the patterning of vias and damascene openings in insulative layers such as silicon oxide or low-k dielectric materials, the high carbon content of the silicon oxycarbide NFARL can cause excessive polymer formation during the dielectric etch. Here etching ceases when the opening becomes pinched off with polymer before endpoint is reached.

Excessive polymer formation during etching, causes a progressive narrowing of the openings during the plasma etching and, in some instances, a pinching off of the etching before the opening is complete. The very small, high aspect ratio contact/via openings in the present sub-tenth micron technology are particularly prone to this problem. The excessive carbon is liberated into the etching plasma by the carbon-containing ARL. In conventional plasma etching of openings in non-carbonaceous dielectric layers, a steady state carbon production is beneficial to obtain vertical sidewalls in the openings. The carbon is released from the photoresist and just enough is deposited onto the sidewalls to protect them from isotropic etching by neutral species in the plasma. It is relatively easy to adjust the plasma parameters and gas flow rates to obtain a desirable steady state condition. However, when the carbon rich ARL also releases considerable carbon into the plasma, the build up of polymer along the sidewalls becomes excessive and the opening into which the directional plasma attacks the base of the opening becomes narrower and finally pinches off.

The problem is illustrated by FIG. 1a where a cross section of wafer substrate 116 with a partial opening 124 for a contact/via in a low-k inorganic dielectric layer 118 is shown. The region 116 could be either the initial bare wafer or the top layer of multiple laminar layers on the wafer which may comprise an etch stop layer or a patterned wiring layer. An excessive rate of polymer 126 formation on the opening walls has caused the opening to progressively narrow and finally pinch-off. The opening 124 was intended to have vertical sidewalls and terminate on the layer 116. A silicon oxycarbide ARL 120 with overlying DUV photoresist 122 were patterned to define the opening 124 and act as a mask for etching a high aspect ratio via in the low-k inorganic layer 118.

The present invention is geared towards reducing the release of carbon species into the etching plasma from the edge of a silicon oxycarbide ARL. While, the non-reflective thin film dielectric materials generally do not reflect incident light back through the photoresist, reflective layers in levels beneath the insulators generate significant reflections to cause aberration of the photoresist. Thus an ARL under the photoresist is still required. It is therefore desirable to have an NFARL material which has all the beneficial qualities of silicon oxycarbide with respect to DUV photolithography, while at the same time, being deficient of carbon, particularly on surfaces where the ARL is exposed during the plasma etching of small openings in the subjacent dielectric. The present invention provides a method for forming a silicon oxycarbide ARL having reduced carbon content, accomplished by replacing Si—C bonds with Si—H bonds.

Gates, et. al. U.S. Patent Application Publication 2003/0134495, cites a hydrogenated silicon carbide ARL wherein a minor amount (1–10 atomic percent) of oxygen may be added. No reason for the oxygen addition is cited. The cited ARL contains between 20 and 40 atomic % carbon. The present inventors find that, in order to reduce polymer production during plasma etching of small openings, the carbon content of the ARL must be less than about 10 atomic %, and, more preferably, less than about 5 atomic %. At the same time, in order to maintain the beneficial qualities of a silicon oxycarbide ARL, the oxygen content, as determined by the present inventors, should be greater than about 20 atomic %.

In order to further improve circuit performance, a number of low dielectric constant (low-k) materials have been developed and incorporated into the dielectric layers of modem integrated circuits. These materials provide a lower capacitance than conventional silicon oxide and consequently, an increase in circuit speed. A first category of low-k materials consists of polymers which rely on porosity and open structure for dielectric constant reduction. Examples of inorganic low-k dielectric materials which have been implemented as ILD (inter level dielectric) layers include the SOGs (spin-on-glasses) and porous silica based materials such as siloxanes, aerogels and xerogels. The porous silica materials have been developed, notably by Texas Instruments Inc. and incorporated into dual damascene processes to obtain dielectric layers with dielectric constants as low as 1.3. This is to be compared with a dielectric constant of about 4 for conventional silicon oxide.

Organic low-k materials such as fluorinated polyarylene ethers, for example FLARE™ (FLuorinated ARylene Ether provided by Allied Signal Inc., 101 Columbia Road, P.O. Box 4000, Morristown, N.J. 07962) and PAE II™ or Lo-KT™ 2000 (Poly Arylene Ether provided by the Schumacher Chemical Company which is a unit of Air Products and Chemicals, Inc., 7201 Hamilton Boulevard, Allentown, Pa. 18195–1501), have been added to the growing family of low-k and ultra low-k dielectric materials. These totally organic, non silicaceous, materials are seeing an increased usage in semiconductor processing technology not only because of their favorable dielectric characteristics, but also because of ease of application.

Quasi-organic low-k materials such as hydrosilsesquioxanes (HSQ) and fluorinated silica glass (FSG), low carbon polysilsesquioxanes, and organosilicate glasses (OSGs), for example Black Diamond™, from Applied Materials Corporation of Santa Clara Calif., have dielectric constants as low as 2.6–2.8. The low carbon polysilsesquioxanes are low density polysilicate glasses which contain alkyl or aryl groups in place of hydrogen. Procedures for application and curing of methyl silsesquioxane low-k polymer films are cited in Chua, et. al. U.S. Pat. No. 6,121,130.

While the organic low-k materials are typically etched in plasmas containing oxygen, the quasi organic and low carbon content organosilicate glasses may be etched with fluorocarbon plasmas with no oxygen content. Li, et. al., U.S. Pat. No. 6,168,726 B1, cites a number of oxygen free fluorocarbon etchants for Black Diamond™ and for HSQ. Lin, et. Al., U.S. Pat. No. 6,372,661 B1 cites the deposition of in Black Diamond™ films and formation of damascene openings therein but does not address problems of excessive polymer formation during plasma etching of narrow contact/via openings.

It is observed by the present inventors, that when sub-tenth micron size contact or via openings, especially, high aspect ratio openings, are etched with fluorocarbon plasmas in low carbon content organosilicate glasses and alkyl polysilsesquioxane low-k layers, the carbon released from these materials causes excessive and undesirable polymer formation which leads to narrowing and, in worst cases, pinching off of the openings, as illustrated in FIG. 1, regardless of the composition of the ARL. The present invention provides a method to overcome this problem as well as that regarding the aforementioned ARL.

SUMMARY OF THE INVENTION

It an object of this invention to provide a method for forming a silicon oxycarbide DUV anti-reflective layer with a reduced carbon content.

It is another object of this invention object of this invention to provide a method for forming a carbon deficient silicon oxycarbide DUV anti-reflective layer having increased Si—H bonding with a correspondingly reduced Si—C bonding.

It is yet another object of this invention to provide a method for reducing the rate of polymer formation during the plasma etching of contact/via openings in inorganic low-k dielectric layers.

These objects are accomplished by utilizing a carbon deficient silicon oxycarbide DUV anti-reflective layer, formed in a plasma ambient containing silane, or an alkyl silane, and $CO_2$ and $H_2$.

It is another object of this invention to provide a method for forming vertical walled high aspect ratio contract/via openings in low carbon quasi-organic and organosilicate low-k glasses with oxygen free fluorocarbon plasmas.

It is yet another object of this invention to provide a method for reducing the rate of polymer formation during the plasma etching of contact/via openings in low carbon quasi-organic and organosilicate low-k glasses.

These objects are accomplished by adding hydrogen to the flow of plasma etching gas, either periodically, continually, or only near and after completion of the etching.

DESCRIPTION OF THE PREFERRED EMBODIMENTS

The embodiments of this invention are particularly directed towards sub-tenth micron feature dimensions and the application of DUV photolithography to pattern contact/via openings in low-k dielectric layers. In a first embodiment of the invention, a via is formed in a low-k inorganic dielectric layer. The low-k dielectric layer is to become an IMD (inter metal dielectric) layer between two wiring levels of an integrated circuit.

Figure 1:
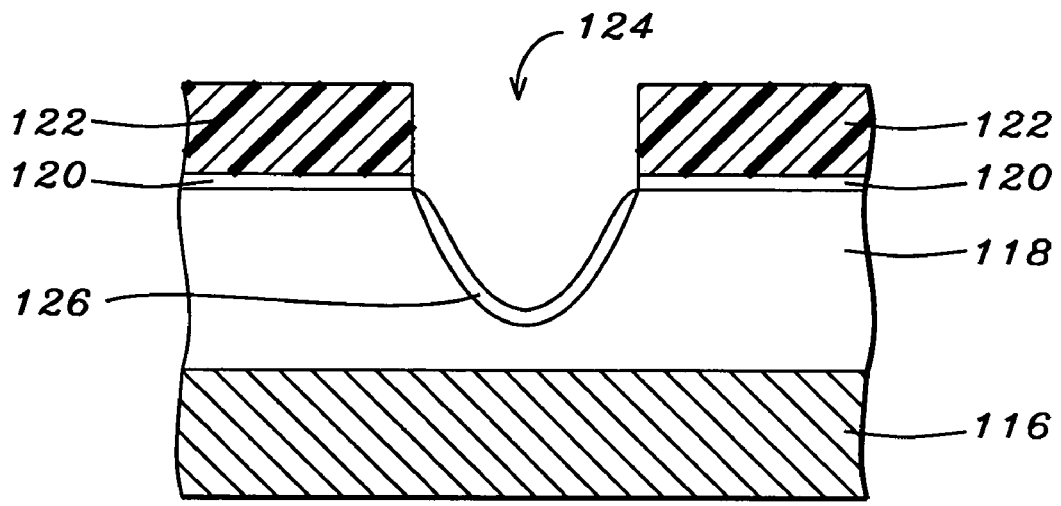
FIG. 1 is a cross section of a portion of an in-process integrated circuit wafer showing the effect of plasma etching a narrow, high aspect ratio contact/via wherein excessive polymer buildup has halted the etching before the opening was completed.
Figure 2A:
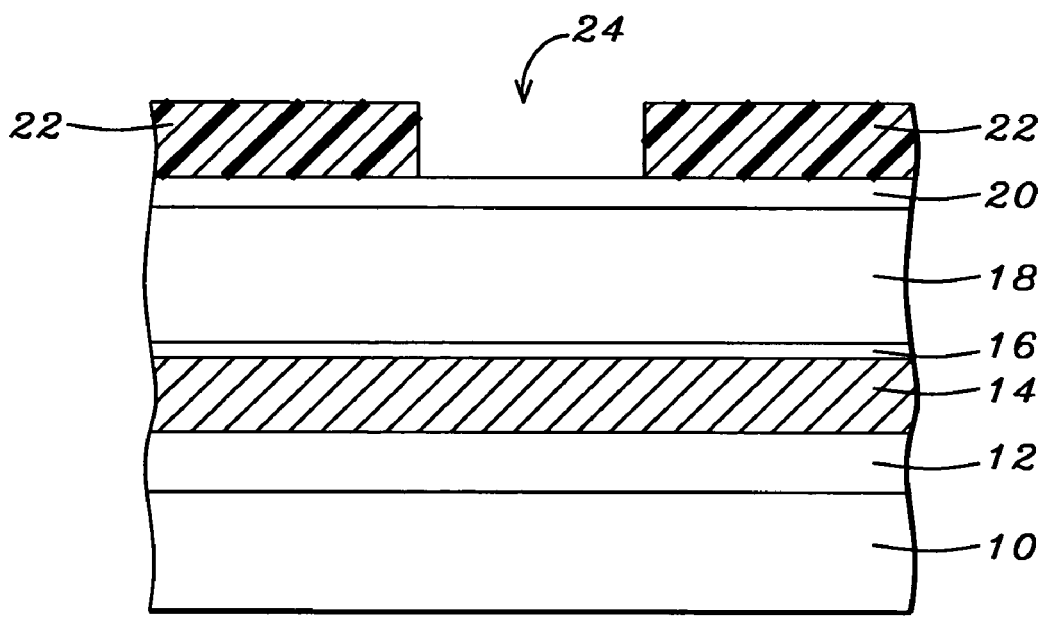
FIG. 2a through FIG. 2d are cross sections illustrating processing steps for forming a contact/via opening in a low-k dielectric layer using DUV photolithography according to the teaching of a first embodiment of the present invention.

Referring to FIG. 2a, a monocrystalline silicon wafer substrate 10 with an insulative layer 12 is provided. Semiconductive devices (not shown) may be formed within the wafer 10 surface by methods well known in the art. A conductive layer, preferably of copper, aluminum, or an aluminum alloy thereof is deposited and photolithographically patterned over the insulative layer 12 by well known methods to forming a level of conductive wiring 14 connecting to elements of the semiconductive devices in wafer 10 through conductive contacts (not shown) in the insulative layer 12.

An etch-stop layer 16 may optionally be formed over the wiring pattern 14. The etch stop layer 16 may consist of a layer of silicon nitride or, in the alternative of, silicon carbide, between about 10 and 1,000 nm. thick, deposited by a CVD process. The etch-stop layer 16 will prevent penetration of the wiring 14 by a subsequent via etch. Alternately, the etch stop layer can be silicon oxynitride or aluminum oxide.

An inorganic low-k dielectric layer 18 is next formed over the wafer 10. The preferred material for the low-k dielectric layer 18 may be selected from the group consisting of an SOG, a siloxane, an aerogel and a xerogel. The dielectric layer 12 is deposited, by a conventional deposition method such as a spin-on technique or a CVD method, for example, HDP (high density plasma CVD) to a thickness of between about 100 and 2000 nm.

An nitrogen free ARL 20 is next formed over the low-k dielectric layer 18 in preparation for the application of DUV photolithography. The ARL 20 in the present embodiment comprises a layer of carbon deficient silicon oxycarbide, between about 10 and 1,000 nm. thick, deposited by PECVD using silane ($SiH_4$) and $CO_2$ as the silicon and carbon precursors respectively. The substrate is heated to a temperature of between about 100 and 400° C. during the ARL deposition. The flow rate of $SiH_4$ is between about 10 and 10,000 SCCM (standard cubic centimeters per minute) and that of $CO_2$ is between about 10 and 10,000 SCCM. In order to achieve reduced carbon in the ARL 20, a flow of Hydrogen at a flow rate of between about 10 and 10,000 SCCM is added to the $SiH_4$/$CO_2$ flow to substitute Si—H bonds in place of C—H bonds in the deposited ARL. The reactant flows are delivered into the reaction chamber in a helium carrier gas flowing at a rate of between about 0 and 10,000 SCCM adjusted to maintain a chamber pressure of between about 1 mTorr and 100 Torr. The added hydrogen produces a carbon deficient silicon oxycarbide ARL wherein the carbon content is less than about 10 atomic %, and, more preferably, less than about 5 atomic %. The oxygen content of the ARL is greater than about 20 atomic %. The Si—C/Si—O bond ratio, as measured by FTIR (Fourier Transfer Infrared) spectroscopy at around 1250 cm.$^{-1}$ should be less than about 18%.

While the presence of $SiH_4$ might be expected to provide enough hydrogen to cause sufficient carbon depletion in the ARL, this is not found to be the case by the present inventors. Because of the relative weakness of Si—H bonding compared to Si—C bonding, the added hydrogen flow was found to be necessary in order maintain a high enough steady state concentration of Si—H over Si—C to sufficiently reduce or stabilize the carbon content of the final ARL in order to effectively curtail the ARL from becoming a significant carbon source during the subsequent low-k etching.

A DUV photoresist is applied and patterned to form a photoresist mask 22 wherein an opening 24 is defined. The wafer substrate 10 is then inserted into the deposition chamber of a HDP (high density plasma) etching tool and the portion of the ARL 20 exposed in the opening 24 is then removed by plasma etching or RIE.

Figure 2B:
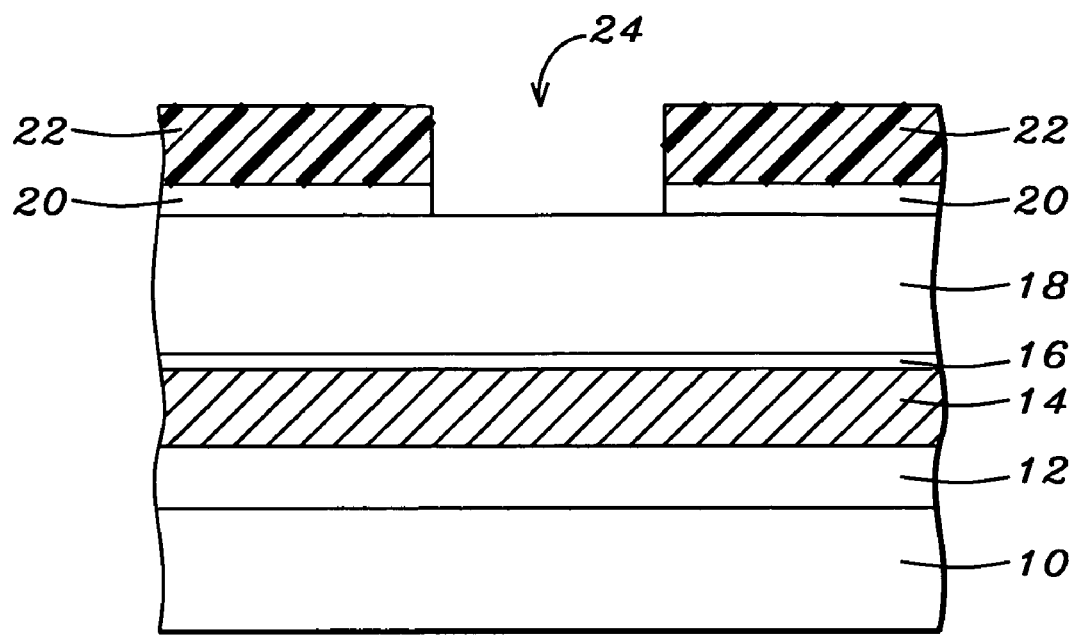
Figure 2C:
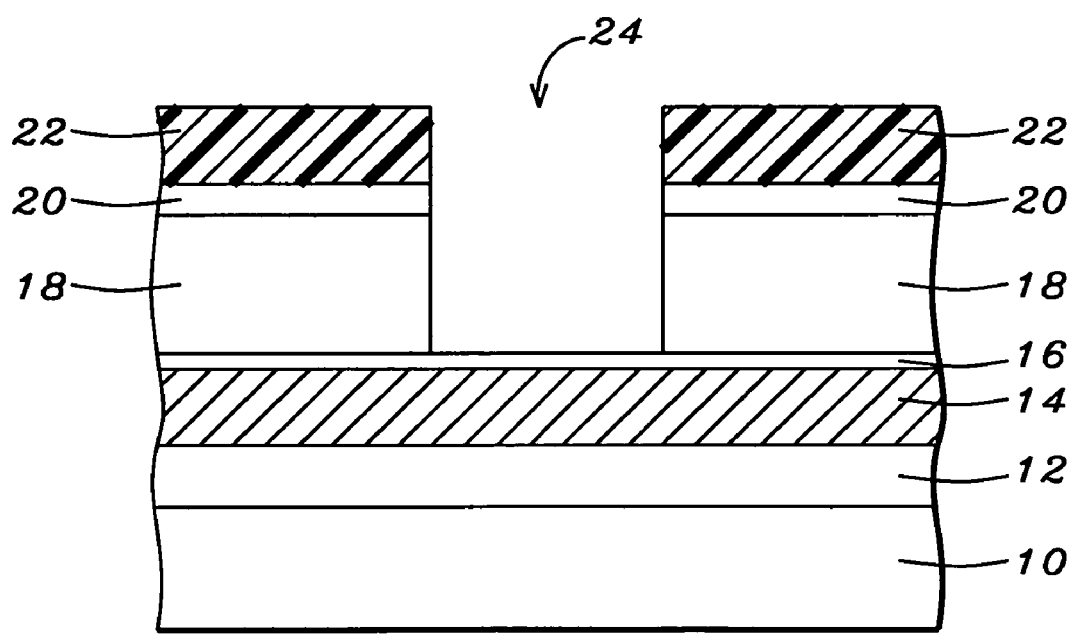

Referring next to FIG. 2b, after the ARL 20 in the opening 24 has been removed, the etching of the via opening in the low-k inorganic dielectric layer 18 is performed in the same etching tool without breaking vacuum. The etchant flow is changed to an ambient containing fluorocarbons or $NF_3$. Endpoint detection is provided by optical emission spectroscopy and sensing endpoint on the oxygen peak. After endpoint, the oxide etch is continued for a timed over-etch period of about 30%. This assures complete opening of the via 24 in the low-k layer 18 (FIG. 2c).

If the optional etch stop layer 16 was included, it is now removed by adding an $O_2$ flow to the fluorocarbon flow for a time period of between about 5 and 30 seconds. Residual photoresist 22 is then stripped, preferably by oxygen ashing although, in the alternative, liquid strippers may be used.

Figure 2D:
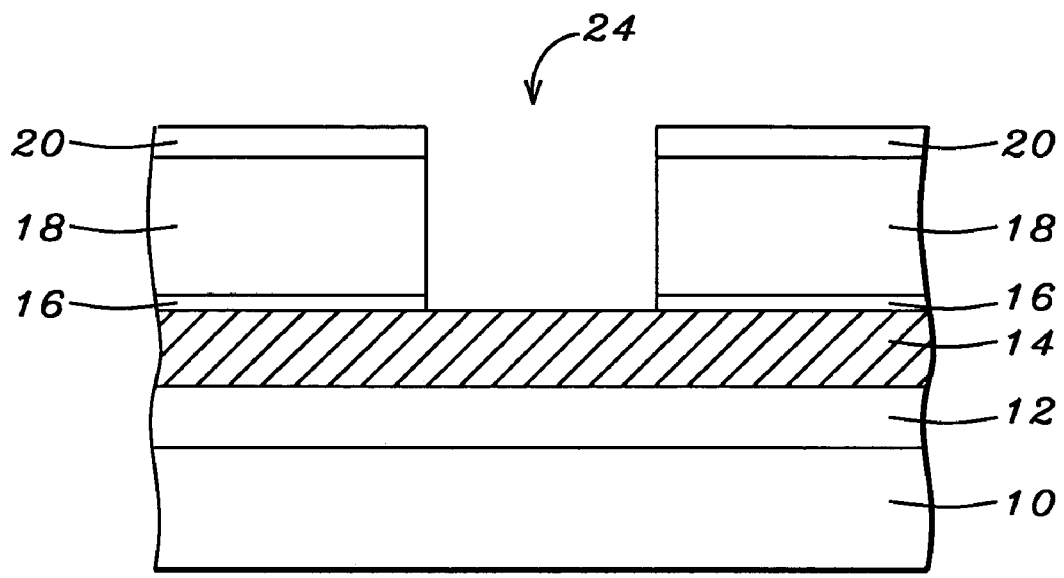

It is not necessary to remove the residual ARL 20 after the via is opened. The residual ARL could be left to become part of the ILD layer or it can be remove by CMP in a later process step. The final via 24 opening, shown in FIG. 2d, has essentially vertical sidewalls and cleanly exposes the conductive wiring 14.

In a second embodiment, a via is formed in a low carbon content organosilicate glass (OSG) dielectric layer. As in the first embodiment the second embodiment employs a carbon deficient silicon oxycarbide ARL and conventional DUV photolithography.

Figure 3A:
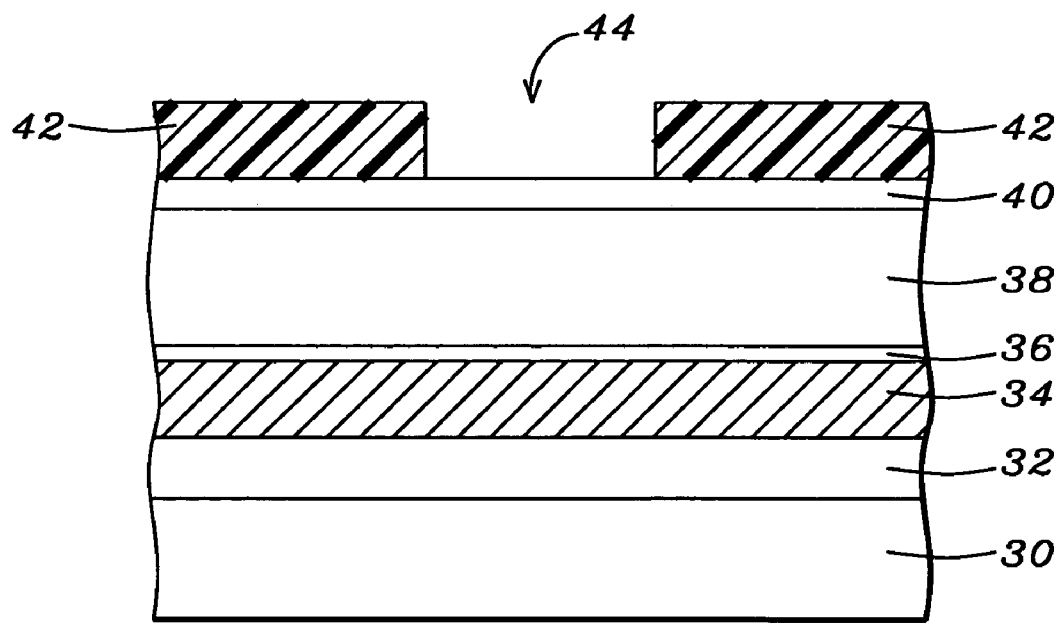
FIG. 3a through FIG. 3d are cross sections illustrating processing steps for forming a contact/via opening in a low-k dielectric layer using DUV photolithography according to the teaching of a second embodiment of the present invention.

Referring to FIG. 3a, a monocrystalline silicon wafer substrate 30 with an insulative layer 32 is provided. Semiconductive devices (not shown) may be formed within the wafer 30 surface by methods well known in the art. A conductive layer, preferably of copper, aluminum, or an aluminum alloy thereof is deposited and photolithographically patterned over the insulative layer 32 by well known methods to forming a level of conductive wiring 34 connecting to elements of the semiconductive devices in wafer 30 through conductive contacts (not shown) in the insulative layer 32.

An etch-stop layer 36 may optionally be formed over the wiring pattern 34. The etch stop layer 36 may consist of a layer of silicon nitride or, in the alternative silicon carbide, between about 10 and 1,000 nm. thick, deposited by a CVD process. The etch-stop layer 36 will prevent penetration of the wiring 34 by a subsequent via etch.

A layer 38 of a low carbon content organo silicate glass, preferably Black Diamond™ is deposited over the etch stop layer 36. The layer 38 is deposited preferably by CVD. A suitable CVD method is described by Yau, et. al., U.S. Pat. No. 6,054,379 The low-k layer 38 is deposited to a thickness of between about 100 and 2,000 nm.

A nitrogen free ARL 40 is next formed over the low-k dielectric layer 38 in preparation for the application of DUV photolithography. The ARL 40 in the present embodiment comprises a layer of carbon deficient silicon oxycarbide, between about 10 and 1,000 nm. Thick, deposited by PECVD using silane ($SiH_4$) and $CO_2$ as the silicon and carbon precursors respectively. The substrate is heated to a temperature of between about 100 and 400° C. during the ARL deposition. The flow rate of $SiH_4$ is between about 10 and 10,000 SCCM and that of $CO_2$ is between about 10 and 10,000 SCCM. In order to achieve reduced carbon in the ARL 40, a flow of Hydrogen at a flow rate of between about 10 and 10,000 SCCM is added to the $SiH_4/CO_2$ flow to substitute Si—H bonds in place of C—H bonds in the deposited ARL. The reactant flows are delivered into the reaction chamber in a helium carrier gas flowing at a rate of between about 0 and 10,000 SCCM adjusted to maintain a chamber pressure of between about 1 mTorr and 100 Torr. The added hydrogen produces a carbon deficient silicon oxycarbide ARL wherein the carbon content is less than about 10 atomic %, and, more preferably, less than about 5 atomic %. The oxygen content of the ARL is greater than about 20 atomic %. The Si—C/Si—O bond ratio, as measured by FTIR (Fourier Transfer Infrared) spectroscopy at around 1250 cm.$^{-1}$ should be less than about 18%.

Figure 3B:
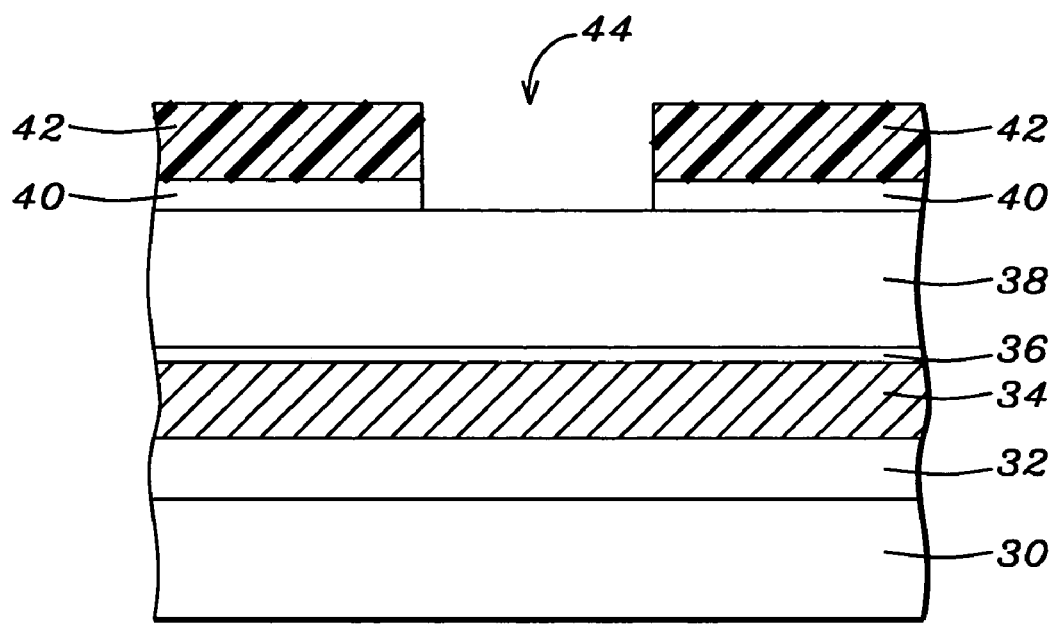

A DUV photoresist is applied and patterned to form a photoresist mask 42 wherein an opening 44 is defined. The wafer substrate 30 is then inserted into the deposition chamber of a HDP (high density plasma) etching tool. Referring next to FIG. 3b, the portion of the ARL 40 exposed in the opening 44 is then removed by plasma etching or RIE.

Figure 3C:
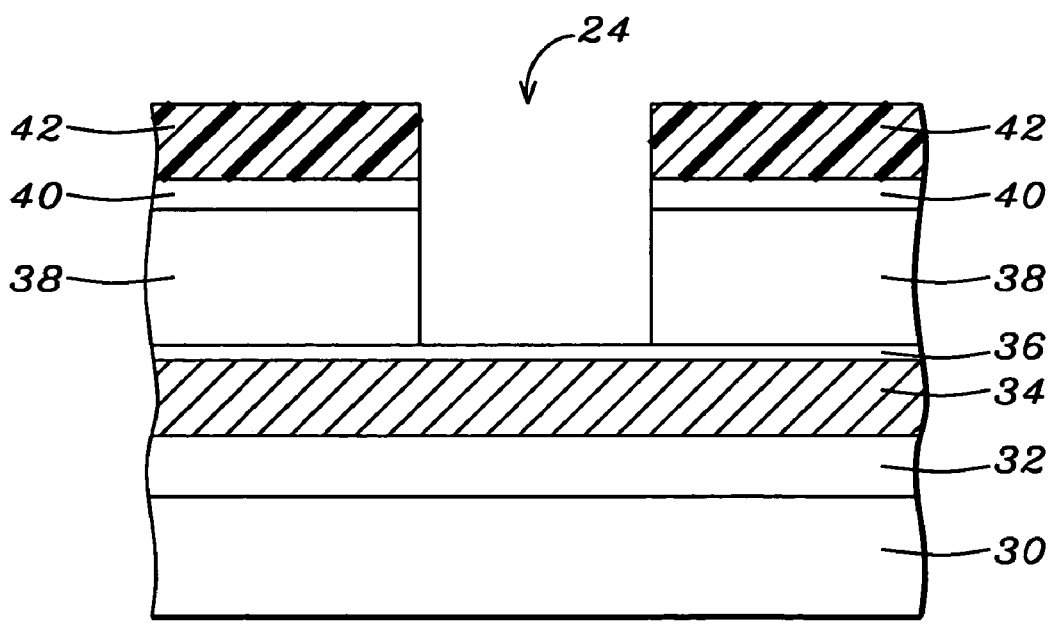

After the ARL 40 in the opening 44 has been removed, the etching of the via opening in the low carbon OSG layer 38 is begun in the same etching tool without breaking vacuum. The etchant flow is changed to an ambient containing fluorocarbons or $NF_3$. A hydrogen flow is added to the etch flow to control polymer formation during the etching of the OSG layer 38. The hydrogen flow may be added intermittently for short periods during the etch period or it may be added continuously at a controlled rate to control the rate of polymer formation. The appropriate regimen for the hydrogen addition to the etchant flow is preferably determined experimentally according to the etching parameters and the observed rate of polymer formation. The later is monitored by observing the behavior of the sidewall profile. Endpoint detection is provided by optical emission spectroscopy and sensing endpoint on the oxygen peak. After endpoint, the oxide etch is continued for a timed over-etch period of about 30%. This assures complete opening of the via 44 in the low-k layer 38 (FIG. 3c). Hydrogen may also be added during the over-etch period and, also for an additional period of several seconds after the flow of etchant gases has been terminated.

If the optical etch stop layer 36 was included, it is now removed by first stopping the hydrogen flow and then adding an $O_2$ flow to the fluorocarbon flow for a time period of between about 5 and 30 seconds. Residual photoresist 42 is then stripped, preferably by oxygen ashing although, in the alternative, liquid strippers may be used.

Figure 3D:
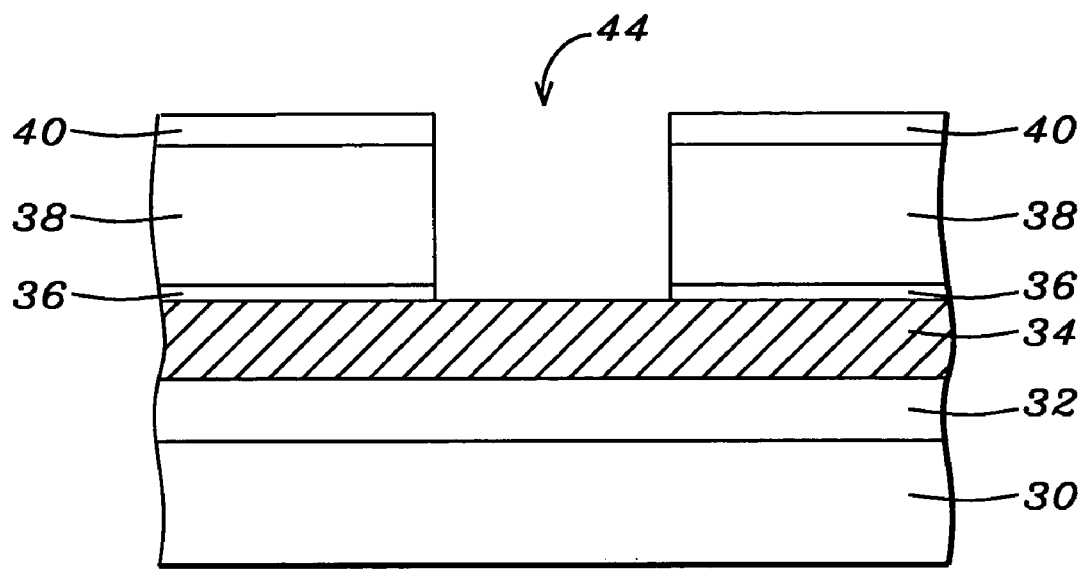

It is not necessary to remove the residual ARL 20 after the via is opened. The residual ARL could be left to become part of the ILD layer or it can be removed by CMP in a later process step. The final via 44, shown in FIG. 3d, has essentially vertical sidewalls and cleanly exposes the conductive wiring 34.

In a third embodiment of this invention, a via opening is formed in a quasi-organic silicate polymer having some organic groups. Such a polymer may be selected from the family of alkyl or aryl polysilsesquioxanes.

Figure 4A:
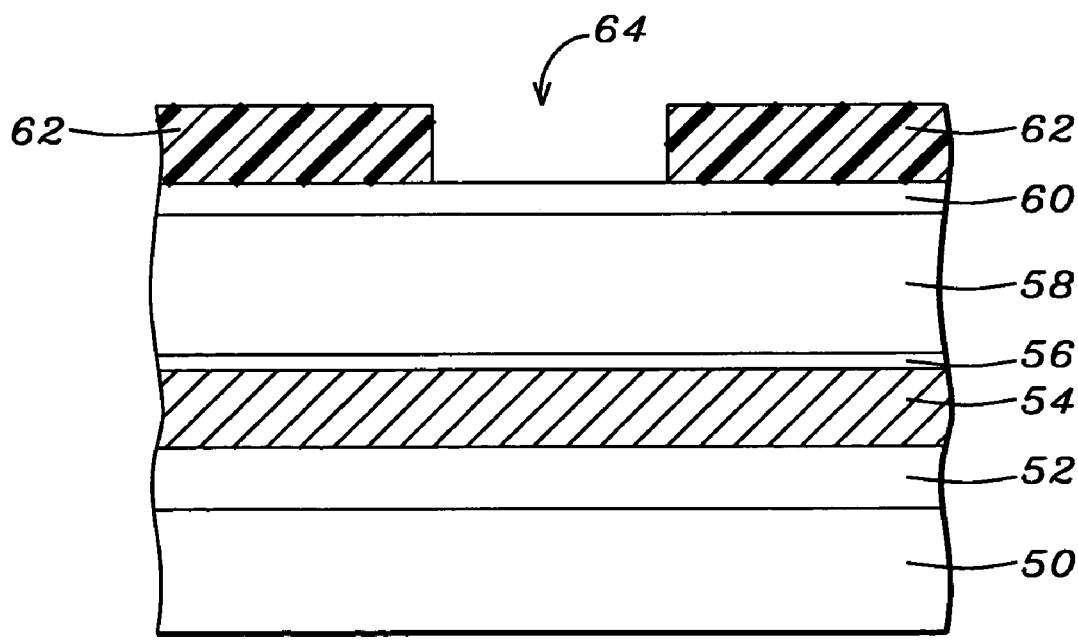
FIG. 4a through FIG. 4d are cross sections illustrating processing steps for forming a contact/via opening in a low-k dielectric layer using DUV photolithography according to the teaching of a third embodiment of the present invention.

Referring to FIG. 4a, a monocrystalline silicon wafer substrate 50 with an insulative layer 52 is provided. Semiconductive devices (not shown) may be formed within the wafer 50 surface by methods well known in the art. A conductive layer, preferably of copper, aluminum, or an aluminum alloy thereof is deposited and photolithographically patterned over the insulative layer 52 by well known methods to forming a level of conductive wiring 54 connecting to elements of the semiconductive devices in wafer 50 through conductive contacts (not shown) in the insulative layer 52.

An etch-stop layer 56 may optionally be formed over the wiring pattern 54. The etch stop layer 56 may consist of a layer of silicon nitride or, in the alternative silicon carbide, between about 10 and 1,000 nm. thick, deposited by a CVD process. The etch-stop layer 56 will prevent penetration of the wiring 54 by a subsequent via etch.

In the present embodiment a layer 58 of an alkyl silsesquioxane monomer, in this example, methyl silsesquioxane, is applied over the etch stop layer 56 with a wafer spin coater. The liquid Methyl silsesquioxane precursor is commercially available as SOP 418 from Allied Signal Advanced Microelectronic Materials, 1349, Moffett Park Drive, Sunnyvale, Calif., 94089 and is carried in an alcoholic solvent. Methyl silsesquioxane is representative of a class of double chain silicate polymer materials which exhibit non-random cross linking forming a three dimensional network when fully cured.

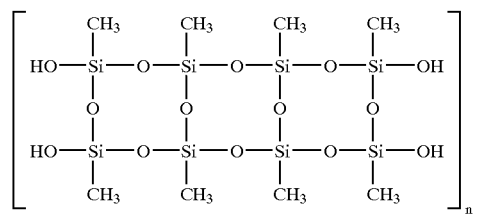

Methyl Silsesquioxane (SOP 418)

Procedures for applying and curing methyl silsesquioxane low-k polymer films are cited by Chua, et. al., *loc. cit.* The polysilsesquioxane layer 58 is deposited to a thickness of between about 100 and 2000 nm.

A nitrogen free ARL 60 is next formed over the polysilsesquioxane layer 58 in preparation for the application of DUV photolithography. The ARL 60 in the present embodiment comprises a layer of carbon deficient silicon oxycarbide, between about 10 and 1,000 nm. Thick, deposited by PECVD using silane ($SiH_4$) and $CO_2$ as the silicon and carbon precursors respectively. The substrate is heated to a temperature of between about 100 and 400° C. during the ARL deposition. The flow rate of $SiH_4$ is between about 10 and 10,000 SCCM and that of $CO_2$ is between about 10 and 10,000 SCCM. In order to achieve reduced carbon in the ARL 60, a flow of Hydrogen at a flow rate of between about 10 and 10,000 SCCM is added to the $SiH_4/CO_2$ flow to substitute Si—H bonds in place of C—H bonds in the deposited ARL. The reactant flows are delivered into the reaction chamber in a helium carrier gas flowing at a rate of between about 0 and 10,000 SCCM adjusted to maintain a chamber pressure of between about 1 mTorr and 100 Torr. The added hydrogen produces a carbon deficient silicon oxycarbide ARL wherein the carbon content is less than about 10 atomic %, and, more preferably, less than about 5 atomic %. The oxygen content of the ARL is greater than about 20 atomic %. The Si—C/Si—O bond ratio, as measured by Fourier transfer Infrared spectroscopy at around 1250 cm.$^{-1}$ should be less than about 18%.

Figure 4B:
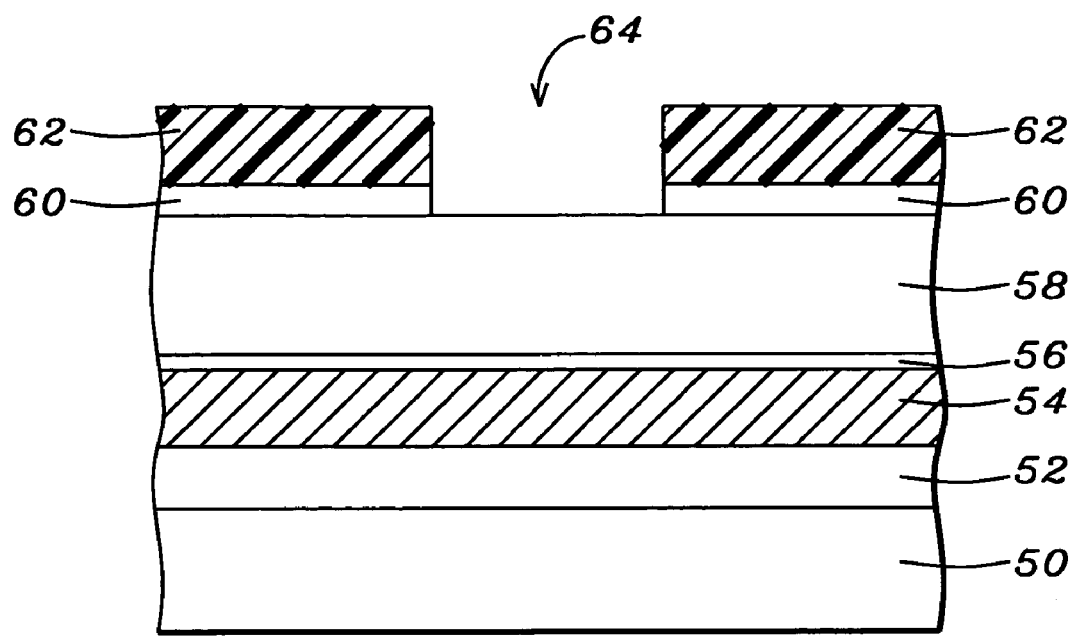
Figure 4C:
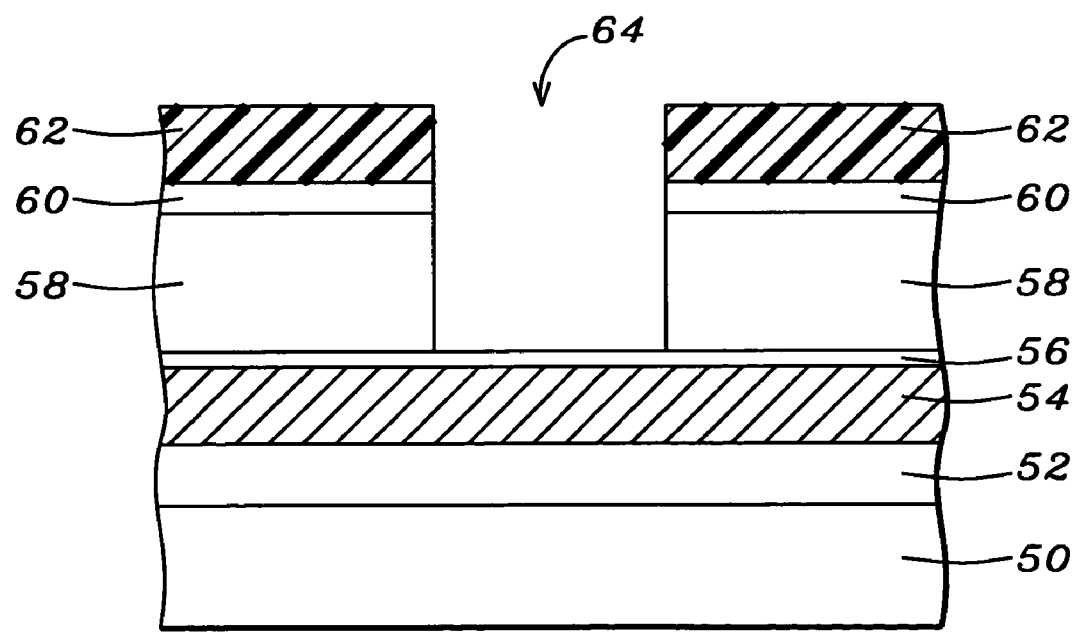

A DUV photoresist is applied and patterned to form a photoresist mask 62 wherein an opening 64 is defined. The wafer substrate 50 is then inserted into the deposition chamber of a HDP (high density plasma) etching tool. Referring next to FIG. 4b, the portion of the ARL 60 exposed in the opening 64 is then removed by plasma etching or RIE. After the ARL in the opening 64 has been removed, the etching of the via opening in the methyl polysilsesquioxane layer 58 is begun in the same tool without breaking vacuum. The etchant flow is changed to an ambient containing fluorocarbons or $NF_3$. A hydrogen flow is added to the etch flow to control polymer formation during the etching of the polysilsesquioxane layer 58. The hydrogen flow may be added intermittently for short periods during the etch period or it may be added continuously at a controlled rate to control the rate of polymer formation. The appropriate regimen for the hydrogen addition to the etchant flow is preferably determined experimentally according to the etching parameters and the observed rate of polymer formation. The latter is monitored by observing the behavior of the sidewall profile. Endpoint detection is provided by optical emission spectroscopy and sensing endpoint on the oxygen peak. After endpoint, the oxide etch is continued for a timed over-etch period of about 30%. This assures complete opening of the via 64 in the low-k layer 58 (FIG. 4c). Hydrogen may also be added during the over-etch period and, also for an additional period of several seconds after the flow of etchant gases has been terminated.

If the optional etch stop layer 56 was included, it is now removed by first stopping the hydrogen flow and then adding an $O_2$ flow to the fluorocarbon flow for a time period of between about 5 and 30 seconds. Residual photoresist 62 is then stripped, preferably by oxygen ashing although, in the alternative, liquid strippers may be used.

Figure 4D:
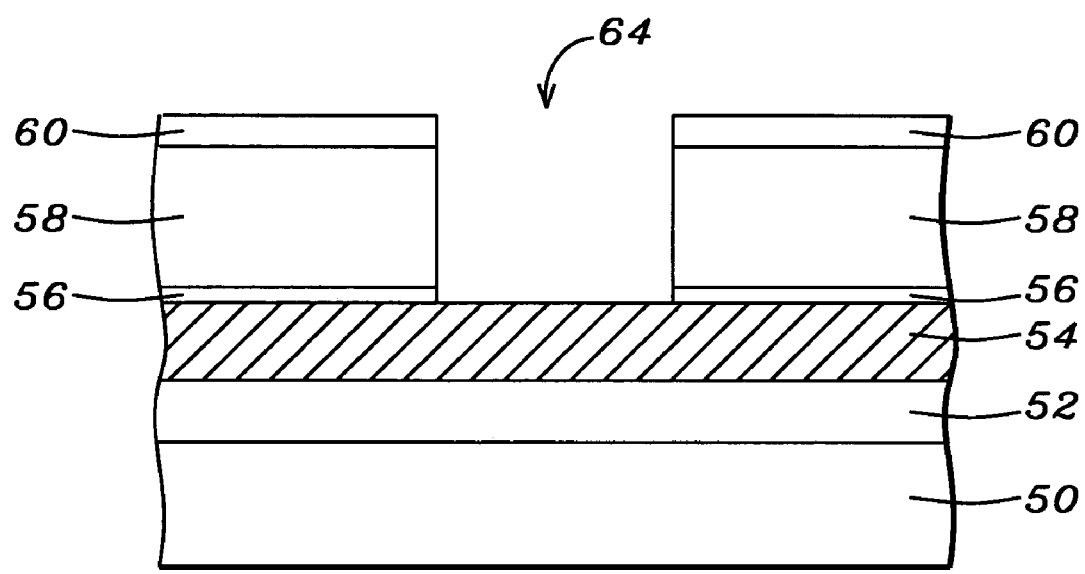

It is not necessary to remove the residual ARL 20 after the via is opened. The residual ARL could be left to become part of the ILD layer or it can be remove by CMP in a later process step. The final via 64, shown in FIG. 4d, has essentially vertical sidewalls and cleanly exposes the conductive wiring 54.

While the invention has been particularly shown and described with reference to the preferred embodiments thereof, it will be understood by those skilled in the art that various changes in form and details may be made without departing from the spirit and scope of the invention. While the embodiments of this invention are directed at the formation of a via in a dielectric layer a contact opening to a semiconductive element could also be formed in a low level dielectric layer by the methods cited without departing from the concepts therein provided.

What is claimed is:

1. A method for forming an opening in a carbon free low-k dielectric layer using DUV photolithography comprising:
    (a) providing a silicon wafer having a conductive wiring element over an insulative layer;
    (b) forming a low-k dielectric layer over said conductive wiring element;
    (c) depositing a carbon deficient silicon oxycarbide ARL over said low-k dielectric layer whereby carbon deficiency is accomplished by introducing hydrogen during said depositing thereby establishing a quantity of Si—H bonding in place of Si—C bonding in said ARL, wherein said carbon deficient silicon oxycarbide ARL contains less than about 10 atomic % carbon;
    (d) patterning a DUV photoresist layer over said ARL to define said opening;
    (e) etching said ARL in said opening thereby exposing said low-k dielectric layer; and
    (f) etching said exposed low-k dielectric layer, thereby exposing said conductive wiring element in said opening.

2. The method of claim 1 wherein said low-k dielectric layer is a spin-on glass, a siloxane, an aerogel, a hydrosilsesquioxane or a xerogel.

3. The method of claim 1 wherein an etch stop layer is deposited between said conductive wiring element and said low-k dielectric layer.

4. The method of claim 3 wherein said etch stop layer is silicon nitride, silicon oxynitride, or aluminum oxide.

5. The method of claim 1 wherein said carbon deficient silicon oxycarbide ARL is deposited by PECVD at a substrate temperature of between about 100 and and 400° C. in an ambient containing $SiH_4$ at a flow rate of between about 10 and 10,000 SCCM, $CO_2$ at a flow rate of between about 10 and 10,000 SCCM, hydrogen at a flow rate of between about 10 and 10,000 SCCM, and a helium carrier gas flowing at a rate of between about 0 and 10,000 SCCM adjusted to maintain a chamber pressure of between about 1 mTorr and 100 Torr.

6. The method of claim 5 wherein said carbon deficient silicon oxycarbide ARL contains less than about 5 atomic % Carbon.

7. The method of claim 5 wherein said carbon deficient silicon oxycarbide ARL contains greater than about 20 atomic % oxygen.

8. The method of claim 1 wherein the Si—C/Si—O bond ratio of said carbon deficient silicon oxycarbide ARL is less than about 18%.

9. The method of claim 1 wherein said etching of said exposed low-k dielectric layer is accomplished by high density plasma etching in a plasma containing a fluorocarbon in a carrier gas of helium.

10. The method of claim 1 wherein said opening is a contact opening or a via opening.

11. A method for forming an opening in a carbon containing low-k dielectric layer using DUV photolithography comprising:
    (a) providing a silicon wafer having a conductive wiring element over an insulative layer;

(b) forming a carbon containing low-k dielectric layer over said conductive wiring element;

(c) depositing a carbon deficient silicon oxycarbide ARL over said carbon containing low-k dielectric layer whereby carbon deficiency is accomplished by introducing hydrogen during said depositing thereby establishing a quantity of Si—H bonding in place of Si—C bonding in said ARL;

(d) patterning a DUV photoresist layer over said ARL to define said opening;

(e) etching said ARL in said opening thereby exposing said carbon containing low-k dielectric layer; and (f) etching said exposed carbon containing low-k dielectric layer in at least the occasional presence of hydrogen, thereby exposing said conductive wiring element in said opening.

12. The method of claim 11 wherein said carbon containing low-k dielectric layer is an aryl polysilsesquioxane, an alkyl polysissesquioxane, or an organosilicate glass.

13. The method of claim 11 wherein an etch stop layer is deposited between said conductive wiring element and said low-k dielectric layer.

14. The method of claim 13 wherein said etch stop layer is silicon nitride, silicon oxynitride, or aluminum oxide.

15. The method of claim 11 wherein said carbon deficient silicon oxycarbide ARL is deposited by PECVD at a substrate temperature of between about 100 and 400° C. in an ambient containing $SiH_4$ at a flow rate of between about 10 and 10,000 SCCM, $CO_2$ at a flow rate of between about 10 and 10,000 SCCM, hydrogen at a flow rate of between about 10 and 10,000 SCCM, and a helium carrier gas flowing at a rate of between about 0 and 10,000 SCCM adjusted to maintain a chamber pressure of between about 1 mTorr and 100 Torr.

16. The method of claim 15 wherein said carbon deficient silicon oxycarbide ARL contains less than about 10 atomic %, and, more preferably, less than about 5 atomic %. Carbon.

17. The method of claim 15 wherein said carbon deficient silicon oxycarbide ARL contains greater than about 20 atomic % oxygen.

18. The method of claim 11 wherein the Si—C/Si—O bond ratio of said carbon deficient silicon oxycarbide ARL is less than about 18%.

19. The method of claim 11 wherein said etching of said exposed carbon containing low-k dielectric layer is accomplished by high density plasma etching in a plasma containing a fluorocarbon and hydrogen.

20. The method of claim 19 wherein said hydrogen is present in said plasma during the entire said etching of said exposed carbon containing low-k dielectric layer.

21. The method of claim 19 wherein said hydrogen is intermittently present in said plasma during said etching of said exposed carbon containing low-k dielectric layer.

22. The method of claim 11 wherein said opening is a contact opening or a via opening.

* * * * *